United States Patent [19]

Kompanek et al.

[11] Patent Number: 4,878,057
[45] Date of Patent: * Oct. 31, 1989

[54] TYPEWRITER KEYBOARD

[75] Inventors: Harry W. Kompanek, Santa Barbara; Rickey H. Ming, Ventura, both of Calif.

[73] Assignee: KDC Corporation, Carpinteria, Calif.

[*] Notice: The portion of the term of this patent subsequent to Apr. 12, 2005 has been disclaimed.

[21] Appl. No.: 14,461

[22] Filed: Feb. 13, 1987

Related U.S. Application Data

[63] Continuation of Ser. No. 417,524, Sep. 13, 1982, abandoned.

[51] Int. Cl.⁴ .................. G06F 3/02; H03M 11/00
[52] U.S. Cl. ........................... 341/34; 310/340; 310/345; 400/479
[58] Field of Search .......... 340/365 R, 365 A, 365 C; 341/22, 33, 34; 178/18; 310/311, 318, 319, 330, 339, 340, 345; 400/479; 200/5 A

[56] References Cited

U.S. PATENT DOCUMENTS 3,503,031  3/1970  Nyhus et al. ............... 340/365 A
4,194,083  3/1980  Abe et al. ....................... 178/18
4,234,813  11/1980 Iguuhi et al. ............... 340/365 A
4,737,767  4/1988  Kompanek et al. ......... 340/365 A Primary Examiner—Donald J. Yusko
Assistant Examiner—Tyrone Queen
Attorney, Agent, or Firm—Ellsworth R. Roston; Charles H. Schwartz

[57] ABSTRACT

A housing is constructed to define individual areas for depression to identify individual indicia such as numbers or the letters of the alphabet. A hard, electrically insulating material is attached to the housing to transmit strains produced in the housing by the depression of the individual areas on the housing. A plurality of thin sheets of an electrically insulating material are provided, each being attached to the insulating material at positions corresponding to the individual areas in the housing. A plurality of thin sheets of an electrically conductive material are also provided, each attached to an associated one of the thin sheets of insulating material. A plurality of ceramic crystals are also included, each attached to an individual one of the electrically conductive sheets. The electrically conductive sheets may be attached to the housing, which is preferably made from an electrically conductive material. This causes one surface of each ceramic crystal to be common to the adjacent area. Each crystal becomes stressed when the keyboard is depressed in the adjacent area on the keyboard. When the crystal becomes stressed, it causes an electrical signal to be generated on the ungrounded surface of the crystal.

51 Claims, 1 Drawing Sheet

U.S. Patent    Oct. 31, 1989    4,878,057
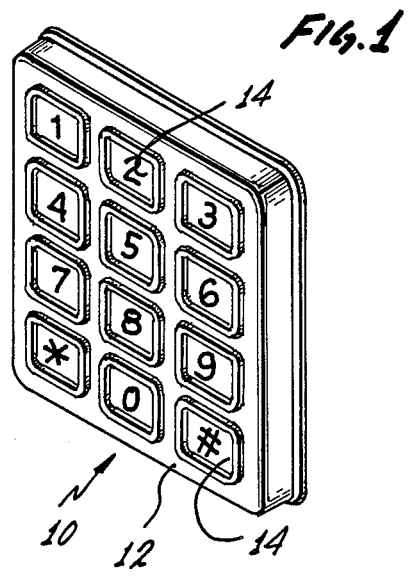
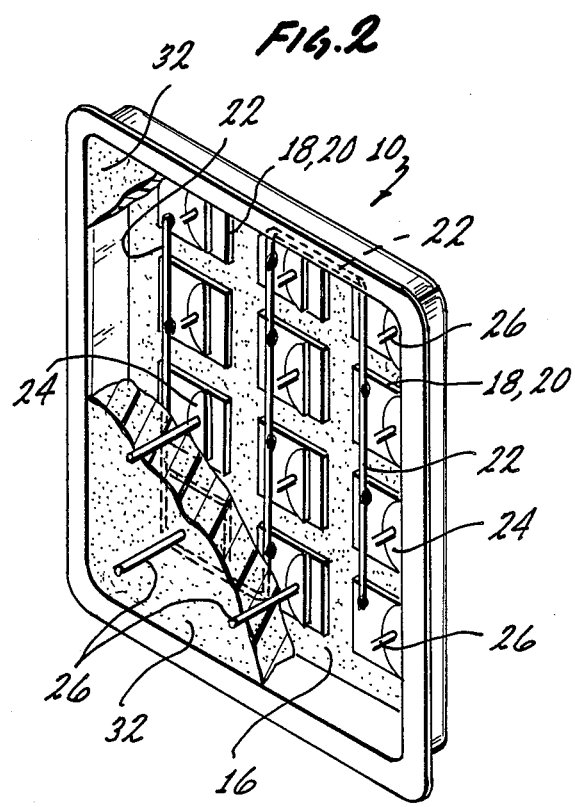
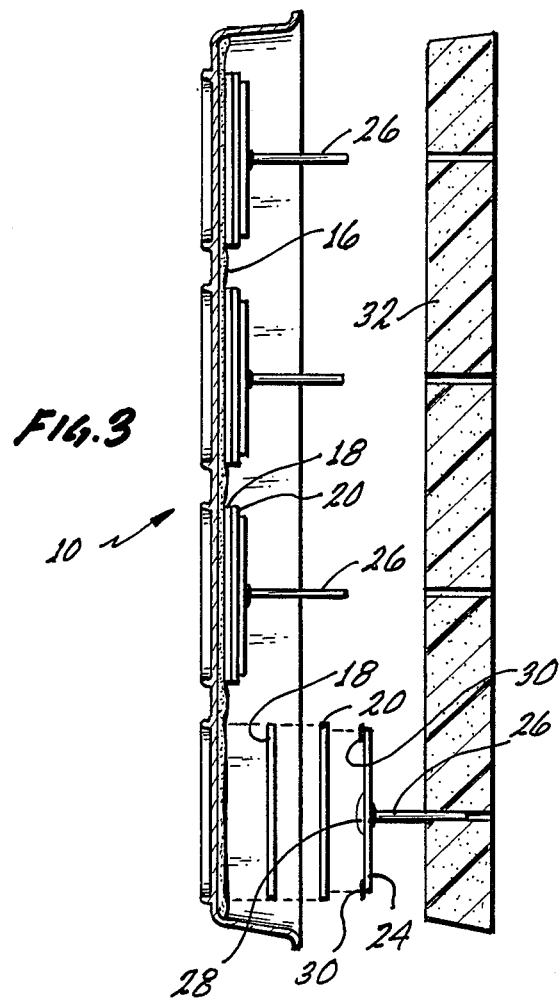
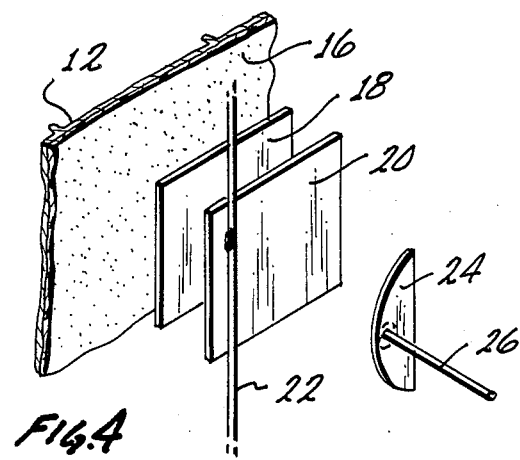

TYPEWRITER KEYBOARD

This is a continuation, of application Ser. No. 417,524, filed Sept. 13, 1982 now abandoned.

This invention relates to keyboards and more particularly relates to keyboards for converting individual actuations of keys to electrical signals indicating the actuation of such keys. The invention especially relates to keyboards employing piezoelectric crystals to obtain the production of such electrical signals.

Keyboards are now in use for a wide variety of purposes. For example, keyboards have been included in typewriters for a considerable number of decades to provide documentary records of the information typed and are still in use for such purposes. Keyboards have also been used for the past several decades to provide messages for data processing purposes. For example, the messages typed on the keyboard represent data which are processed by data processing equipment to generate new or updated data.

The keyboards now in use generally have certain limitations. They generally include keys with movable parts. When the key is actuated, the parts are moved to provide an indication of the symbol represented by the key. These parts tend to become worn with continued use. When the parts become sufficiently worn, they operate inadequately and cause incorrect, or at least incomplete, information to be generated.

Another problem with typewriter keyboards now in use is that they require power supplies in order to convert mechanical forces to electrical signals. These power supplies tend to increase the size, cost and weight of the typewriter keyboards. Since these factors are important from psychological and competitive standpoints, the provision of a keyboard operative to generate electrical signals without the use of a power supply would provide an important advantage from a competitive and psychological standpoint.

Since equipment employing keyboards is in widespread use, considerable effort and money have been expended in developing a keyboard which will operate without any mechanical parts and without any power supplies. Considerable effort and money have also been expended in providing a keyboard which is compact, sensitive and reliable. In spite of such efforts, the problems discussed above still exist in keyboards.

This invention provides a keyboard which eliminates the above disadvantages. The keyboard has no moving parts and requires no power supply. However, the keyboard is still able to generate a large and reliable electrical signal. Furthermore, the keyboard can be operated with a normal amount of pressure on the keys to generate such a large and reliable electrical signal.

In one embodiment of the invention, a housing is constructed to define individual areas for depression to identify individual indicia such as numbers or the letters of the alphabet. A hard, electrically insulating material is attached to the housing to transmit strains produced in the housing by the depression of the individual areas on the housing. A plurality of thin sheets of an electrically insulating material are provided, each being attached to the insulating material at positions corresponding to the individual areas in the housing. A plurality of thin sheets of an electrically conductive material are also provided, each attached to an associated one of the thin sheets of insulating material. A plurality of ceramic crystals are also included, each attached to an individual one of the electrically conductive sheets.

The electrically conductive sheets may be attached to the housing, which is preferably made from an electrically conductive material. This causes one surface of each ceramic crystal to be common to the adjacent area. Each crystal becomes stressed when the keyboard is depressed in the adjacent area on the keyboard. When the crystal becomes stressed, it causes an electrical signal to be generated on the ungrounded surface of the crystal.

In the drawings:

FIG. 1 is a perspective view of a keyboard constituting one embodiment of the invention; the keyboard being viewed from a position in front, and to one side of the keyboard;

FIG. 2 is a perspective view of the keyboard shown in FIG. 1; as seen from a position to the rear and to one side of the keyboard;

FIG. 3 is an enlarged elevational view, in exploded sections of the keyboard shown in FIGS. 1 and 2; and FIG. 4 is an enlarged exploded fragmentary view in perspective of certain elements included in the keyboard shown in the previous Figures.

In one embodiment of the invention, a keyboard generally indicated at 10 is provided. The keyboard includes a housing 12 preferably made from an electrically conductive material such as a stainless steel or anodized aluminum. The housing 12 is preferably made from a sheet material about twenty thousandths inches (0.020") thick but the thickness may be any suitable value such as in the range of ten thousandths inches (0.010") to sixty thousandths inches (0.060").

The housing 12 is provided with different areas 14 which are depressed to identify individual indicia. For example, these areas may represent different numerals or different letters of the alphabet. When the different areas 14 are depressed, forces are created in these areas and these forces are used to generate electrical signals. The individual areas 14 on the housing can be considered to be the keys of the keyboard 10.

A suitable material such as an epoxy 16 is adhered to the housing 12 and is provided with characteristics to transmit the force or stress imposed on the different keyboard areas 14 when these areas are depressed. The epoxy 16 is provided with a relatively high durometer such as a durometer of 96 but may be provided with any suitable durometer such as in a range of 70 to 98. The epoxy is preferably an Emerson & Cumming Number 2850 epoxy with a catalyst No. 11 to provide for a fast drying.

Preferably the epoxy 16 is heavily filled and mixed with a ceramic powder made from a suitable material such as aluminum oxide. The ceramic-filled epoxy is provided with characteristics so that it will not produce voids when it is applied to the housing. Voids are undesirable since they inhibit the transmission of the forces applied to the different keyboard areas 14 on the housing 12. The ceramic-filled epoxy 16 is preferably applied to the housing 12 in a thickness in the order of tens of thousandths of an inch.

Sheets 18 of backing material made from a suitable electrically insulating material such as fiberglass are adhered to the epoxy 16 at positions adjacent the keyboard areas 14. The insulating sheets 18 are preferably provided with a suitable thickness such as thirty thousandths inches (0.030"). However, the sheets 18 can have any suitable thickness such as a thickness in the order of fifteen thousandths inches (0.015") to sixty thousandths inches (0.060").

A thin sheet 20 of an electrically conductive material is adhered in a conventional manner to each of the insulating sheets 18. For example, the sheets 20 may be made from a suitable material such as copper. The sheets 20 are preferably provided with a suitable thickness such as five thousandths of an inch (0.005"), or even less, but thicknesses as high as sixty thousandths of an inch (0.060") are satisfactory. The insulating sheets 18 and the conductive sheets 20 may constitute segments of a thin printed circuit board. The sheets 20 are preferably grounded to one another and to the housing 12 by a wire 22 attached as by solder to the sheets 20 and the housing.

Crystals 24 made from a suitable material such as a ceramic are included, each being attached to an individual one of the conductive sheets 20. The crystals 24 are preferably piezoelectric and polarized. The crystals 24 are preferably made from a mixture of lead zirconate and lead titanate in a particular proportion such as approximately fifty-two percent (52%) lead zirconate and approximately forty-eight percent (48%) lead titanate by weight. A suitable material such as niobium oxide or columbium oxide is preferably included in the mixture in a relatively small amount such as approximately eight-tenths of a percent (0.8%) by weight. The niobium oxide or columbium oxide increases the dielectric constant and the piezoelectric constants of the crystals 24. A dash of lanthanum oxide may also be included in the mixture. The crystals may be equivalent to those designated as PZT 5, which has a dielectric constant of at least 1700 and a Curie point of approximately 330° C.

The crystals 24 may be provided with a suitable thickness such as approximately ten thousandths of an inch (0.010"). However, the crystals 24 may be provided with a suitable thickness in a range of approximately seven thousandths of an inch (0.007") to approximately twenty thousandths of an inch (0.020"). Electrical leads 26 may be included, each being attached to the ungrounded surface of an individual one of the crystals 24. The leads 26 may introduce electrical signals from the crystals 24 to associated apparatus (not shown).

The crystals 24 are adhered to the conductive sheets 20 by a suitable material 28 preferably having electrically conductive properties. For example, a suitable epoxy such as that designated as 60L by Emerson &. Cumming of Canton, Massachusetts, is mixed with a graphite powder to make it conductive and may be applied in a small dab to the central area of each crystal 24. Each crystal 24 may then be adhered to an associated one of the conductive sheets 20. A small amount 30 of the same epoxy as the epoxy 16 may then be applied around the periphery of each of the crystals 24.

A suitable covering 32 may be applied over the crystals 24 and the conductive sheets 20 and even the epoxy 16. The covering 30 may be a suitable material such as an epoxy with a durometer of approximately 90. A relatively small amount of particles of a suitable material such as chromium oxide may be mixed in the epoxy to increase the durometer of the epoxy and to provide it with a distinctive color such as green. For example, approximately twenty-five grams (25 g) to fifty grams (50 g) of chromium oxide may be mixed with one pound (1 lb.) of epoxy.

When individual ones of the keyboard areas 14 are depressed, the resultant forces are transmitted through the epoxy 16 to the crystals 24. The crystals then become strained to produce signals on the ungrounded terminals of the crystals. These signals have relatively large amplitudes. For example, the signals may have amplitudes of approximately four (4) or five (5) volts. These signals may then be used to operate associated apparatus (not shown).

The keyboard described above has certain important advantages. It converts depressions of the keyboard area 14 to the generation of electrical signals by the crystals 24 without any moving parts and without the inclusion of an energy source such as a battery. Furthermore, it provides for the generation of signals of large amplitudes by the crystals 24 by providing for an efficient transmission of forces from the keyboard 12 through the epoxy coating 16 and the epoxy covering 32. The keyboard is accordingly sensitive, reliable, small and long-lived.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

We claim:

1. In combination,
   a housing constructed of a depressible material to define individual areas for depression to identify individual indicia,
   a hard electrically insulating material adhered to the housing at the individual areas of the housing and depressible to transmit strains produced in the housing by the depression of housing at the individual areas in the housing,
   a plurality of thin sheets of an electrically insulating material each attached to the hard insulating material at positions corresponding to the individual areas in the housing and depressible to transmit strains,
   a plurality of thin sheets of an electrically conductive member each adhered to an individual one of the electrically insulating sheets at one of the individual areas of the housing and depressible to transmit strains, and
   a plurality of crystals having first and second flat surfaces, each of the crystals having first and second flat surfaces, each of the crystals being adhered at its first flat surface to an individual one of the electrically conductive sheets at one of the individual areas of the housing and being depressible to produce an electrical signal at the second flat surface in accordance with such depression.

2. The combination set forth in claim 1, including,
   each of the crystals being adhered to the associated one of the electrically conductive thin sheets in electrically conductive relationship with such electrically conductive sheet, and
   means establishing a common ground to the electrically conductive thin sheets,
   the housing being made from an electrically conductive material defining a ground and the ground establishing means also establishing a common ground from the thin electrically conductive sheets to the housing.

3. The combination set forth in claim 1, including,
   each of the thin sheets of electrically insulating material being associated with an individual one of the thin sheets of electrically conductive material and an individual one of the crystals and each of the thin sheets of electrically insulating material being closer to the housing than the associated one of the thin sheets of electrically conductive material and being closer to the housing than the associated one of the crystals.

4. The combination set forth in claim 3, including,
the first surface of the crystals being adhered to the electrically conductive thin sheets in electrically conductive relationship with the electrically conductive thin sheets,
a common ground between the electrically conductive thin sheets and the housing, and
an individual connection to the second flat surface of each crystal.

5. The combination set forth in claim 4, including, an insulating coating over the crystals on the ungrounded surfaces of the crystals.

6. The combination set forth in claim 4 wherein
the common ground is provided by a wire attached to the electrically conductive thin sheets and the housing.

7. The combination set forth in claim 1 wherein
the hard electrically insulating material is an epoxy.

8. In combination,
a housing having a plurality of spaced areas each for identifying an individual symbol, the housing being constructed of a depressible material to be depressed at the individual ones of the spaced areas in the plurality and to become strained in such individual ones of such spaced areas by such depressions, the housing being made from an electrically conductive material,
a plurality of crystals each disposed in spaced but adjacent relationship to an individual one of the spaced areas on the housing and having first and second opposite surfaces, the crystals being constructed to be depressed and to produce electrical signals upon such depression,
a plurality of means for retaining the crystals in the plurality in spaced but adjacent relationship to the housing and for insulating such crystals electrically from the housing and for transmitting to such crystals the strains imposed in the housing by the depression of the housing at individual ones of the spaced areas in the housing, each of the retaining means in the plurality fully occupying, without any air pockets, the space between individual ones of the crystals in the plurality and the housing at the associated ones of the spaced areas of the housing and having properties of being depressed in accordance with the depressions in the associated ones of such spaced areas and being adhered to the associated one of the crystals in the plurality and the housing at the associated one of such spaced areas,
the retaining means including a thin layer of a hard electrically insulating material applied to the housing at the positions of the spaced areas in the housing to transmit from the housing to the crystals in the plurality the forces imposed upon the housing by the depression of the housing at the spaced areas.

9. The combination set forth in claim 8, including,
the retaining means including a plurality of electrically insulating layers each disposed between the housing at an individual one of the spaced areas in the housing and an individual one of the crystals and providing for an adherence of the associated one of the crystals to the housing and providing a high durometer and provided with characteristics for an efficient transmission of forces from the housing at an associated one of the spaces in the housing to the associated one of the crystals.

10. The combination set forth in claim 8, including,
each of the crystals having first and second opposite surfaces,
a plurality of thin electrically conductive sheets each disposed between the first surface of an individual one of the crystals in the plurality and an individual one of the retaining means in the plurality at one of the spaced areas in the housing and being grounded electrically to the housing,
means for adhering the first surfaces of individual ones of the crystals in the plurality to the associated ones of the electrically conductive sheets in the plurality and for providing in such adherence for an electrically conductive relationship between the individual ones of the first surfaces of the associated crystals and the associated ones of the electrically conductive sheets in the plurality, and
a plurality of means each connected to the second surface of an individual one of the crystals in the plurality for providing an electrical signal having characteristics representative of the strain produced in such individual crystal by the depression of the housing at the associated one of the spaced areas in the plurality.

11. The combination set forth in claim 10, including,
each of the retaining means in the plurality and the associated one of the thin electrically conductive sheets in the plurality defining a printed circuit,
each of the crystals being formed from a thin sheet of piezoelectric material.

12. The combination set forth in claim 10, including,
means for grounding the electrically conductive sheets to the housing.

13. The combination set forth in claim 11, including,
the retaining means including an electrically insulating layer disposed between the housing and the crystals and providing a durometer greater than 70 and providing for an adherence of the thin backing sheet to the housing without any voids, and
means for grounding the electrically conductive sheets to the housing.

14. A combination as set forth in claim 13 wherein
the grounding means includes a wire connected to the electrically conductive sheets and the housing.

15. In combination,
a housing having a plurality of spaced areas each for identifying an individual symbol, the housing being constructed of a depressible material to be depressed at teh individual ones of the spaced areas in the plurality and to become strained in such individual ones of such spaced areas by such depressions, the housing being made from an electrically conductive material,
a plurality of crystals each disposed in spaced but adjacent relationship tao an individual one of the spaced areas on the housing and having first and second opposite surfaces, the crystals being constructed to be depressed and to produce electrical signals upon such depression,
a plurality of means for retaining the crystals in the plurality in spaced but adjacent relationship to the housing and for insulating such crystals electrically from the housing and for transmitting to such crystals the strains imposed in the housing by the depression of the housing at individual ones of the spaced areas in the housing, each of the retaining means in the plurality fully occupying, without any air pockets, the space between individual ones of the crystals in the plurality and the housing and having properties of being depressed in accordance with the depressions in the associated ones of such spaced areas and being adhered to the associated one of the crystals in the plurality and the housing at the associated one of such spaced areas, each of the crystals having first and second opposite surfaces, a plurality of thin electrically conductive sheets each disposed between the first surface of an individual one of the crystals in the plurality and an individual one of the retaining means in the plurality at one of the spaced areas in the housing and being grounded electrically to the housing, means for adhering the first surfaces of individual ones of the crystals in the plurality to the associated ones of the electrically conductive sheets in the plurality and for providing in such adherence for an electrically conductive relationship between the individual ones of the first surfaces of the associted crystals and the associated ones of the electrically conductive sheets in the plurality, and a plurality of means each connected to the second surface of an individual one of the crystals in the plurality for providing an electrical signal having characteristics representative of the strain produced in such individual crystal by the depression of the housing at the associated one of the spaced areas in the plurality, each of the retaining means in the plurality and the associated one of the thin electrically conductive sheets in the plurality defining a printed circuit, each of the crystals being formed from a thin sheet of piezoelectric material, each of the electrically insulating retaining means in the plurality being disposed between the housing and the associted one of the thin electrically conductive sheets in the plurality and being adhered to the housing and the associated one of the thin electrically insulating backing sheets in the plurality.

16. In combination, a housing having a plurality of spaced areas each for identifying an individual symbol, the housing being constructed to be depressed at individual ones of the spaced areas to become depressions, a plurality of crystals each formed from a thin sheet of material and each associated with the housing at an individual one of the spaced areas in the housing and each constructed to produce electrical signals in accordance with strains imposed upon such crystal, means defining an electrically grounded plane for one surface of each crystal, such electrically grounded means being disposed between the housing and the associated crystal, electrically insulating means disposed between the electrically grounded plane and the housing at individual ones of the spaced areas in the housing and adhering the electrically grounded plane to the housing at such individual ones of the spaced areas in the housing and providing for a transmission to associated ones of the crystals of stresses imposed upon such individual areas of the housing, and means including a layer of a hard insulating material adhered to the housing for providing for the transmittal of electrical signals from the ungrounded surfaces of the associated crystals in the plurality in accordance with the depression of the housing at the individual areas of the housing, the housing, the means defining the ground plane, the electrically insulating means, the layer of hard insulating material and the transmittal means being constructed and disposed, for each of the crystals in the plurality and the housing, at the associated one of the spaced areas in the housing to define successive layers without any voids.

17. The combination set forth in claim 16, including, the electrically insulating means being provided with a durometer greater than 70.

18. A combination as set forth in claim 16 wherein the housing is electrically connected to the electrically grounded plane.

19. In combination, a housing having a plurality of spaced areas each for identifying an individual symbol, the housing being constructed to be depressed at individual ones of the spaced areas to become strained at such spaced areas in accordance with such depressions, a plurality of crystals each formed from a thin sheet of material and each associated with the housing at an individual one of the spaced areas in the housing and each constructed to produce electrical signals in accordance with strains imposed upon such crystal, means defining an electrically grounded plane for one surface of each crystal, such electrically grounded means being disposed between the housing and the associated crystal, electrically insulating means disposed between the electrically grounded plane and the housing at individual ones of the spaced areas in the housing and adhering the electrically grounded plane to the housing at such individual ones of the spaced areas in the housing and providing for a transmission to associated ones of the crystals of stresses imposed upon such individual areas of the housing, and means for providing for the transmittal of electrical signals from the ungrounded surfaces of the associated crystals in the plurality in accordance with the depression of the housing at the individual areas of the housing, the housing, the means defining the ground plane, the electrically insulating means and the transmittal means being constructed and disposed, for each of the crystals in the plurality and the housing, at the associated one of the spaced areas in the housing to define successive layers without any voids, and a plurality of insulating means each defining a backing for the electrically grounded plane and each disposed between the electrically insulating means and the electrically grounded plane and each adhered by the adhering means and each providing an insulation for an individual one of the crystals without any voids and each disposed and constructed to transmit strains for the housing at an individual one of the spaced areas in the housing to an associated one of the crystals in the plurality.

20. The combination set forth in claim 19, including, a second layer of electrically insulating means covering the ungrounded surfaces of the crystals, and electrical leads attached to the ungrounded surfaces of the cyrstals to provide for the transmittal of electrical signals from the ungrounded surfaces of the crystals.

21. A combination as set forth in claim 20 wherein the housing is electrically conductive and is electrically connected to the electrically grounded plane, and the electrically insulating backing means are adhered to the electrically grounded plane.

22. A combination as set forth in claim 21 wherein the electrically ground plane is adhered to first surfaces of the crystals.

23. In combination, a housing having a plurality of areas each constructed to be depressed to identify an individual symbol, the housing being constructed from a material to transmit forces imposed upon the individual areas of the housing upon the depression of such individual areas, means adhered to one surface of the housing at the individual areas of the housing and having properties of providing an electrical insulation and of transmitting forces imposed upon the housing at the individual areas of the housing, a plurality of crystals each formed from a thin sheet of material and each responsive to the stresses transmitted through the adhering means from the housing at an individual one of the areas of the housing and each constructed to produce electrical signals in accordance with its response to such transmitted forces, and an electrically insulating backing plane and an electrically conductive ground plane for each individual one of the crystals in the plurality, the backing plane and the ground plane disposed between the adhering means and the crystals to position the crystals in removed relationship to the housing, the electrical insulating backing plane being adhered to the adhering means, the electrically conductive ground plane being disposed in electrical contact with an abutting surface of each of the crystals and abutting the electrically insulating backing plane, the electrically insulating backing plane and the electrically insulating backing plane and the electrically insulating ground plane being constructed to transmit forces from individual ones of the spaced areas in the housing to associated ones of the crystals in the plurality.

24. The combination set forth in claim 23 wherein the housing is made from an electrically conductive material and the housing is connected to the ground plane and the adhering means is an epoxy and the means defining the backing plane is a fiberglass.

25. The combination set forth in claim 23, including, the adhering means including an epoxy with a durometer greater than approximately 70 and with dense characteristics and further including particles of a material mixed with the spoxy to prevent voids from being formed in the epoxy.

26. The combination set forth in claim 23, including, an epoxy adhering a surface of each crystal to the electrically conductive ground plane and including particles of an electrically conductive material in the epoxy to ground electrically the adhered surface of the crystal and the housing being constructed of an electrically conductive material and being connected to the ground plane.

27. The combination set forth in claim 25, including, an additional layer of epoxy covering the crystals and the adhering means and provided with a reduced durometer relative to the durometer of the adhering means.

28. The combination set forth in claim 27, including, an epoxy adhering each crystal to an associated one of the electrically conductive ground planes and including particles of an electrically conducting material in the epoxy to ground electrically the adhered surface of the crystal.

29. In combination, a housing constructed to define a particular area depressible to identify an individual indicium, a hard electrically insulating material adhered to the housing in abutting relationship with the particular area in the housing to transmit strains produced in the housing by the depression of the housing at the particular area in the housing, a thin sheet of an electrically insulating material adhered to the hard electrically insulating material at a position corresponding to the particular area in the housing and constructed to transmit strains produced in the housing by the depression of the particular area in the housing, a thin sheet of an electrically conductive member adhered to the electrically insulating sheet at a position corresponding to the particular area in the housing and constructed to transmit strains produced in the housing by the depression of the housing at the particular area in the housing, a crystal having a first surface attached to the electrically conductive sheet in an electrically conductive relationship with the sheet and constructed to be strained and to produce an electrical signal when strained, and means defining a ground plane and attached to the thin sheet of the electrically conductive member.

30. The combination set forth in claim 29, including, the crystal having a second surface opposite to the first surface, and means providing an electrical connection to the second surface of the crystal to receive the electrical signals on the second surface of the crystal.

31. The combination set forth in claim 29, including, each of the thin sheets of electrically insulating material being associated with an individual one of the thin sheets of electrically conductive material and an individual one of the crystals and being disposed closer to the housing than the associated one of the thin sheets of electrically conductive material and being disposed even closer to the housing than the associated one of crystals.

32. The combination set forth in claim 31, including, the housing being electrically conductive, and the means defining the ground plane being attached to the housing to ground the ground plane to the housing.

33. The combination set forth in claim 32 including, the crystal having a second surface opposite to the first surface, the second surface of the crystal being ungrounded, and an insulating coating over the second surface of the crystal.

34. In combination, a housing having a particular area depressible to produce strains in the housing to identify an individual symbol, the housing being made from an electrically conductive material, a crystal disposed in spaced but adjacent relationship to the particular area on the housing to become constrained upon the depression of the particular area and to produce an electrical signal in accordance with such constraint, means for retaining the crystal in spaced but adjacent relationship to the particular area in the housing and the crystal and for insulating the crystal from the housing and for transmitting to the crystal the strains imposed in the housing by the depression of the particular area in the housing, the retaining means including a hard electrically insulating material adhered to the housing at the particular area and depressible to transmit strains produced in the housing by the depression of the housing at the particular area, means for electrically grounding the housing and the surface of the crystal facing the housing, and means connected to the surface of the crystal removed from the housing for providing signals having chracteristics representative of the constraint produced on the crystal by the depression of the housing at the particular area.

35. The combination set forth in claim 34, including, the retaining means including a hard electrically insulating layer disposed, without voids, between the housing and the crystal and providing for an adherence of the crystal to the housing.

36. The combination set forth in claim 34, including, the electrically grounding means including:

a thin electrically conductive sheet disposed between the crystal and the retaining means, and means for adhering the crystal to the electrically conductive sheet and for providing for an electrically conductive relationship between the electrically conductive sheet and the abutting surface of the crystal, and means for grounding the electrically conductive sheet to the housing.

37. In combination, a housing having a particular area depressible to produce strains in the housing to identify an individual symbol, the housing being made from an electrically conductive material, a crystal disposed in spaced but adjacent relationship to the particular area on the housing to become constrained upon the depression of the particular area and to produce an electrical signal in accordance with such constraint, means for retaining the crystal in spaced but adjacent relationship to the particular area in the housing and the crystal and for insulating the crystal from the housing and for transmitting to the crystal the strains imposed in the housing by the depression of the particular area in the housing, means for electrically grounding the housing and the surface of the crystal facing the housing, and means connected to the surface of the crystal removed from the housing for providing signals having characteristics representative of the constraint produced on the crystal by the depression of the housing at the particular area, a segment of a printed circuit member including a thin backing sheet of an electrically insulating material and a thin electrically conductive sheet adhered to the backing sheet, the crystal being formed from a thin sheet of piezoelectric material and being adhered to the electrically conductive sheet in electrically conductive relationship to the sheet.

38. The combination set forth in claim 37, including, the adhering means having a durometer of at least 70.

39. In combination, a housing having a particular area depressible to impose strains for identifying an individual symbol, a crystal formed from a thin sheet of material defined by first and second opposite surfaces and constructed to be strained to produce electrical signals, means operatively coupled to the first surface of the crystal and defining an electrical ground plane for the first surface of the crystal and constructed to transmit to the crystal the stresses imposed upon the housing at the particular area of the housing, electrically insulating means disposed between the means defining the ground plane and the particular area in the housing and adhering the means defining the ground plane to the particular area in the housing without voids and providing for a tramsmission to the crystal of stresses imposed upon the housing at the particular area of the housing by the depression of the housing in the particular area, and the electrically insulating means including a hard electrically insulating material adhered to the housing and depressible to transmit to the crystal the force produced by the depression of the housing at the particular position, means for providing for the transmittal of electrical signals from the second surface of the crystal.

40. The combination set forth in claim 39, including, the insulating means including means defining a backing for the means defining the ground plane and adhered to the means defining the ground plane and constructed to transmit strains imposed upon the housing at the particular area of the housing.

41. The combination set forth in claim 40, including, means for grounding the electrically conductive sheets to the housing.

42. The combination set forth in claim 40, including, the electrically insulating means being provided with a durometer of at least 70 and without voids to transmit to the crystal the stresses imposed upon the particular area of the housing.

43. The combination set forth in claim 41 wherein the electrically insulating means is formed from an epoxy mixed with particles of a filler to inhibit the formation of voids in the electrically insulating means.

44. The combination set forth in claim 40 wherein the insulating means defining the backing for the ground plane is made from a fiberglass.

45. In combination, a housing having a particular area constructed to be depressed to identify an individual symbol, the housing being constructed from a material to become stressed in the particular area of the housing in accordance with the depression of the housing at the particular area, adhering means attached to the housing and having properties of providing an electrical insulation and of transmitting forces imposed upon the housing at the particular area of the housing by the depression of the housing at the particular area, a crystal formed from a thin sheet of material and responsive to the stresses transmitted through the adhering means from the particular area of the housing in accordance with the depression of the housing at the particular area of the housing and constructed to produce electrical signals in accordance with such transmitted stresses, and means defining an electrically insulating backing plane for the crystal and means defining an electrically conducting ground plane for the crystal, the electrically insulating means and the electrically conducting means defining printed circuit means, such printed circuit means being adhered to the adhering means at the position of the particular area in the housing and to the crystal with the crystal disposed in removed relationship to the housing relative to the backing plane and the ground plane and the electrically conducting ground plane engaging a first surface of the crystal in electrically conductive relationship with the crystal, the printed circuit means being constructed to transmit to the crystal the forces imposed upon the housing at the particular area of the housing.

46. The combination set forth in claim 45 wherein the housing is made from an electrically conductive material and the thin sheet defining the ground plane is connected electrically to the housing.

47. The combination set forth in claim 45, including, the adhering means including an epoxy with a durometer of at least 70 and with dense characteristics and further including particles of a material mixed with the epoxy to prevent voids from occurring in the adhering means.

48. The combination set forth in claim 45, including, an epoxy adhering the crystal to the ground plane and including particles of an electrically conductive material in the epoxy to ground electrically the adhered surface of the crystal.

49. The combination set forth in claim 47, including, an additional layer of epoxy covering the crystal and the adhering means and provided with a reduced durometer relative to the durometer of the adhering means.

50. The combination set forth in claim 49, including, an epoxy adhering the first surface of the crystal to the ground plane and including particles of an electrically conducting material in the epoxy to ground electrically the first surface of the crystal.

51. The combination set forth in claim 46 wherein the backing plane is a fiberglass.

* * * * *